(12) United States Patent
Liao et al.

(10) Patent No.: US 9,007,088 B2
(45) Date of Patent: Apr. 14, 2015

(54) PROTECTING QUANTUM ENTANGLEMENT FROM AMPLITUDE DAMPING IN A TWO QUBIT SYSTEM

(71) Applicants: Texas A&M University System, College Station, TX (US); King Abdulaziz City for Science and Technology, Riyadh (SA)

(72) Inventors: Zeyang Liao, College Station, TX (US); M. Al-Amri, Riyadh (SA); M. Suhail Zubiary, College Station, TX (US)

(73) Assignees: Texas A&M University System, College Station, TX (US); King Abdulaziz City for Science and Technology, Riyadh (SA)

( * ) Notice: Subject to any disclaimer, the term of this patent is extended or adjusted under 35 U.S.C. 154(b) by 198 days.

(21) Appl. No.: 13/854,727

(22) Filed: Apr. 1, 2013

(65) Prior Publication Data
US 2014/0292367 A1     Oct. 2, 2014

(51) Int. Cl.
 *H03K 19/195* (2006.01)
 *B82Y 10/00* (2011.01)
 *G06N 99/00* (2010.01)

(52) U.S. Cl.
 CPC .............. *H03K 19/195* (2013.01); *B82Y 10/00* (2013.01); *G06N 99/002* (2013.01); *Y10S 977/933* (2013.01)

(58) Field of Classification Search
 CPC ... G06N 99/002; H03K 19/195; B82Y 10/00; B82Y 15/00

USPC .......... 326/1–7; 977/933; 708/490; 716/110, 716/132, 136, 30
See application file for complete search history.

(56) References Cited

U.S. PATENT DOCUMENTS

| | | | |
|---|---|---|---|
| 7,893,708 B2 | 2/2011 | Baumgardner et al. | |
| 7,996,452 B1 | 8/2011 | Cruz-Albrecht et al. | |
| 8,111,083 B1 | 2/2012 | Pesetski et al. | |
| 8,350,587 B2 * | 1/2013 | Zubairy et al. | 326/3 |
| 2008/0310000 A1 * | 12/2008 | Beausoleil et al. | 359/108 |
| 2010/0251049 A1 * | 9/2010 | Goto et al. | 714/746 |
| 2012/0098564 A1 * | 4/2012 | Zubiary et al. | 326/3 |

OTHER PUBLICATIONS

G. Rempe and H. Walther, "Observation of Quantum Collapse and Revival in a One-Atom Maser," Physical Review Letters, vol. 58, No. 4, pp. 353-356, Jan. 26, 1987.
G. Rempe, F. Schmidt-Kaler, and H. Walther, "Observation of Sub-Piossonian Photon Statistics in a Micromaser," Physical Review Letters, vol. 64, No. 23, pp. 2783-2786, Jun. 4, 1990.

(Continued)

*Primary Examiner* — Jason M Crawford
*Assistant Examiner* — Christopher Lo
(74) *Attorney, Agent, or Firm* — Wong, Cabello, Lutsch. Rutherford & Brucculeri LLP (57) ABSTRACT

Preservation of quantum entanglement in a two-qubit system is achieved by use of the disclosed systems. Three different example two-qubit systems are shown: (1) a system employing a weak measurement, (2) a system in which a generalized amplitude dampening occurs without use of a weak measurement, and (3) an extended system in which the system is prepared in a more robust state less susceptible to decoherence prior to a generalized amplitude dampening.

20 Claims, 8 Drawing Sheets

(56) References Cited

OTHER PUBLICATIONS

M. Brune, F. Schmidt-Kaler, A. Maali, J. Dreyer, E. Hagley, J.M. Raimond, and S. Haroche, "Quantum Rabi Oscillation: A Direct Test of Field Quantization in a Cavity," Physical Review Letters, vol. 76, No. 11, pp. 1800-1803, Mar. 11, 1996.

Q. Sun, M. Al-Amri, and M. Suhail Zubairy, "Reversing the Weak Measurement of an Arbitrary Field with Finite Photon Number," Physical Review A, vol. 80, No. 3, pp. 033838-1-033838-5, Sep. 25, 2009.

A. Rauschenbeutel, G. Nogues, S. Osnaghi, P. Bertet, M. Brune, J.M. Raimond, and S. Haroche, "Coherent Operation of a Tunable Quantum Phase Gate in Cavity QED," Physical Review Letters, vol. 83, No. 24, pp. 5166-5169, Dec. 13, 1999.

M. Al-Amri, M. O. Scully, and M. S. Zubairy, "Reversing Weak Measurement on a Qubit," Journal of Physics B: Atomic, Molecular and Optical Physics, vol. 4, No. 16, pp. 165509-1-165509-5, Jul. 29, 2011.

M. S. Zubairy, "Erasing Memory and Quantum Reversibility," presented at the Workshop on Quantum Nonstationary Systems, Brasilia, Brazil on Oct. 20, 2009.

By D'Ariano et. al., "Quantum Computations with Polarized Photons," Fortschr. Phys., vol. 48 at 573-577 (2000).

Z. Liao et al., "Protecting Quantum Entanglement from Amplitude Dampening," uploaded to arxiv.org Aug. 2012.

* cited by examiner

PROTECTING QUANTUM ENTANGLEMENT FROM AMPLITUDE DAMPING IN A TWO QUBIT SYSTEM

CROSS-REFERENCE TO RELATED APPLICATIONS

The present invention generally relates to U.S. Pat. No. 8,350,587, which is jointly owned by the same joint owners of the present application.

FIELD OF THE INVENTION

The present invention generally relates to systems and methods for quantum computing, and in particular relates to quantum entanglement in a two qubit system.

BACKGROUND

The basic unit of information processing in modern day computers is a bit, which can exist in one of two states: 0 or 1. In quantum computing, the basic unit of information processing is a qubit. Like a bit, the qubit can also exist in two states, which states are denoted as state $|0\rangle$ and state $|1\rangle$. But unlike a bit, a qubit can exist in superposition states, which are a linear combination of state $|0\rangle$ and state $|1\rangle$. For example, if the qubit were to be denoted by $|\psi\rangle_{in}$, then the superposition states of the qubit can be described by the expression: $|\psi\rangle_{in} = \alpha|0\rangle + \beta|1\rangle$, where $\alpha$ and $\beta$ are complex amplitudes (also known as probability amplitudes), and where $\alpha^2 + \beta^2 = 1$. Therefore, the qubit $|\psi\rangle_{in}$ can exist in any of the states described by variables $\alpha$ and $\beta$. This property of qubits is essential in quantum computing. Therefore, if the qubit $|\psi\rangle_{in}$ is prepared in a superposition state for quantum computing, then it is essential that this superposition state be maintained throughout the computing process, meaning that the state may need to be recovered after it is determined (i.e., read).

Results of a quantum computation require that one or more qubits of the quantum computer be measured. Two kinds of measurements can be carried out on a qubit $|\psi\rangle_{in}$: a strong measurement and a weak measurement. In a strong measurement, the qubit ceases to exist in the superposition state, and collapses into one of its so-called eigenstates, i.e., $|0\rangle$ and $|1\rangle$. An example of a strong measurement is a detector detecting a click in a cavity quantum electrodynamics (QED) system, where measuring a click indicates that the qubit $|\psi\rangle_{in}$ has collapsed into state $|1\rangle$. Because of the collapse of the superposition state, information related to the original state of the system cannot be recovered. In other words, the values of $\alpha$ and $\beta$ are lost.

In a weak measurement, full collapse into the eigenstate does not take place, and it is possible to reverse the measurement so that the original state of the system is recovered. This reversal is possible, because for weak measurements, information of the probability amplitudes $\alpha$ and $\beta$ involved in the superposition of the states is retained. One example of a weak measurement is leakage of a field inside a cavity QED system. For example, if a detector does not register a click after a time $\tau$, then the state evolves into $|\psi(\tau)\rangle_d = (\alpha|0\rangle + e^{-\Gamma\tau}\beta|1\rangle)/\sqrt{|\alpha|^2 + |\beta|^2 e^{-2\Gamma\tau}}$, where $\Gamma$ is the cavity decay rate, and $\tau$ is the duration of the weak measurement.

A weak measurement thus retains partial information on the state of the qubit $|\psi\rangle_{in}$: information regarding $\alpha$ and $\beta$ are present, although the amplitude of the state is dampened. Thus, unlike strong measurements, weak measurements provide the possibility of recovering the qubit to its original superposition state. This also applies for weak measurements implemented in systems other than cavity QED systems.

U.S. Pat. No. 8,350,587 describes methods and systems for recovering a state of a qubit to its original state where the qubit has been transformed by a weak measurement and hence amplitude dampened. The '587 patent is incorporated herein in its entirety, and because of its general relevance to the inventive techniques that follow, some time is spent in this Background discussing the technique of the '587 patent.

Figure 1:
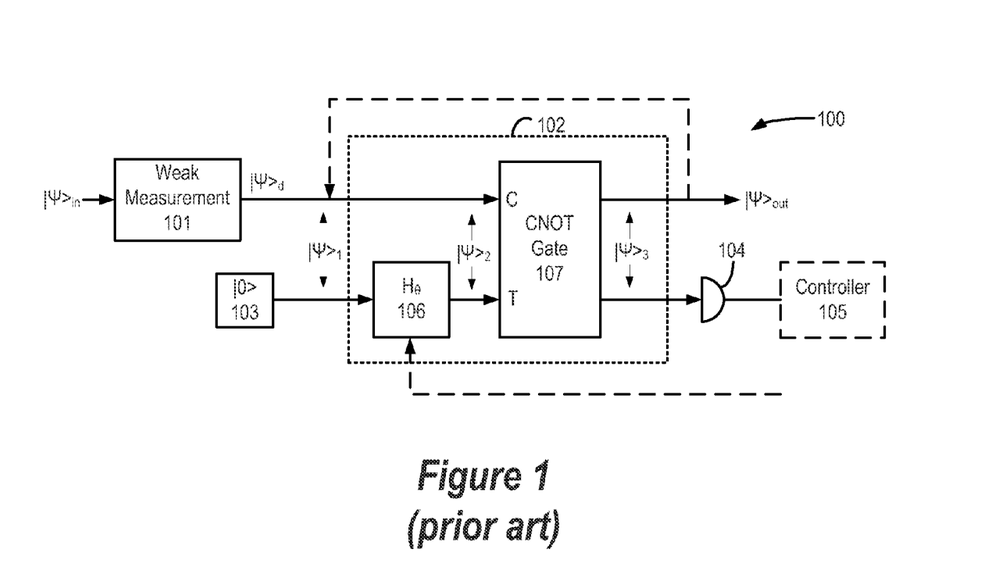
FIG. 1 shows a schematic of a system for reversing a state of a qubit after a weak measurement to its original state in accordance with the prior art.

As shown in FIG. 1, the system 100 disclosed in the '587 patent uses an additional qubit, referred to as an ancillary qubit 103, to recover the measured qubit $|\psi\rangle_{in}$ to its original state after a weak measurement 101. System 100 includes a reversing circuit 102, which receives the dampened amplitude $|\psi\rangle_d$ of the weakly-measured qubit $|\psi\rangle_{in}$ as one of its inputs. Reversing circuit 102 also receives the ancillary qubit 103 ($|0\rangle$). The state of the ancillary bit 103 at the output of the reversing circuit 102 is measured by a detector 104.

The output of the detector 104 is fed to a controller 105, which, based on the detector's 104 output, determines whether the state of the qubit $|\psi\rangle$ has been recovered. If the controller 105 determines that the state has not been recovered, then the system performs another iteration: another ancillary bit 103 is input to the reversing circuit 102; the qubit $|\psi\rangle_{out}$ at the output of the reversing circuit 102 is fed back to the reversing circuit; and a rotation angle of Hadamard gate 106 is appropriately modified, as exemplified by the dotted lines. This process is iteratively repeated until the state of the qubit $|\psi\rangle_{out}$ is determined to be recovered.

As discussed above, the original state of the qubit $|\psi\rangle_{in}$ can be expressed as $\alpha|0\rangle + \beta|1\rangle$. Due to the weak measurement, the state of the qubit $|\psi\rangle_d$ evolves into: $|\psi\rangle_d = (\alpha|0\rangle + e^{-\Gamma\tau}\beta|1\rangle)/\sqrt{|\alpha|^2 + |\beta|^2 e^{-2\Gamma\tau}}$. For simplicity, we denote $N_0 = \sqrt{|\alpha|^2 + |\beta|^2 e^{-2\Gamma\tau}}$, and rewrite the state of qubit v) after a weak measurement as:

$$|\psi\rangle_d = (\alpha|0\rangle + e^{-\Gamma\tau}\beta|1\rangle)/N_0 \quad\quad (B)$$

The reversing circuit 102 includes a Hadamard gate $H_\theta$ 106 and a CNOT gate 107. The two-qubit input to the reversing circuit 102 (i.e., $|\psi\rangle_d$ and $|0\rangle$) can be represented as $|\psi_{12}\rangle$, and the state of this two-qubit system can be expressed as:

$$|\psi_1\rangle = (\alpha|0\rangle + e^{-\Gamma\tau}\beta|1\rangle)/N_0 \otimes |0\rangle \quad\quad (C)$$

The Hadamard gate $H_\theta$ 106 transforms the ancillary qubit 103 ($|0\rangle$) into $\cos\theta|0\rangle + \sin\theta|1\rangle$, where $\theta$ is a rotation angle. Because this is the first iteration of the system, $\theta$ is denoted as $\theta_1$. Thus, the result of the Hadamard gate $H_\theta$ 106 transforming qubit $|\psi_1\rangle$ can be expressed as:

$$|\psi_2\rangle = (\alpha|0\rangle + e^{-\Gamma\tau}\beta|1\rangle)/N_0 \otimes (\cos\theta_1|0\rangle + \sin\theta_1|1\rangle) \quad\quad (D)$$

$$|\psi_2\rangle = (\alpha\cos\theta_1|0\rangle|0\rangle + e^{-\Gamma\tau}\beta\cos\theta_1|1\rangle|0\rangle + \alpha\sin\theta_1|0\rangle|1\rangle + e^{-\beta\tau}\sin\theta_1|1\rangle|1\rangle)/N_0 \quad\quad (E)$$

State $|\psi_2\rangle$, as expressed in Equation (E), is then input to the CNOT gate 107. As is well known, the CNOT gate 107 is a controlled NOT gate having a control input (C) and a target input (T). The CNOT gate flips the state of the target input only if the control input is $|1\rangle$. In Equation (E), for each of the four terms that are summed, the first qubit state corresponds to the control input and the second qubit state corresponds to the target input. Thus for each of the terms in Equation (E) where the first qubit is $|1\rangle$, the second qubit will be flipped. Thus, the CNOT gate 104 transforms the state $|\psi_2\rangle$ as follows:

$$|\psi_3\rangle = (\alpha \cos \theta_1 |0\rangle |0\rangle + e^{-\Gamma\tau}\beta \cos \theta_1 |1\rangle |1\rangle +$$
$$\alpha \sin \theta_1 |0\rangle |1\rangle + e^{-\Gamma\tau}\beta \sin \theta_1 |1\rangle |0\rangle)/N_0 \quad (F)$$

Rearranging the terms in Equation (F) results in:

$$|\psi_3\rangle = ((\alpha \cos \theta_1 |0\rangle + e^{-\Gamma\tau}\beta \cos \theta_1 |1\rangle) \otimes |0\rangle +$$
$$(\alpha \sin \theta_1 |0\rangle + e^{-\Gamma\tau}\beta \sin \theta_1 |1\rangle) \otimes |1\rangle)/N_0 \quad (G)$$

In each of the two summed terms of Equation (G), the right side term in the tensor product represents the state of the ancillary bit while the left hand term represents the state of the system after CNOT transformation. Therefore, if the state of the ancillary bit were to be measured, the result of the measurement would provide the state of the qubit $|\psi\rangle_{out}$. For example, if state of the ancillary bit measured by the detector 104 is $|0\rangle$, then the state of the qubit $|\psi\rangle_{out}$ would be $\alpha \cos \theta_1 |0\rangle + e^{-\Gamma\tau}\beta \sin \theta_1 |1\rangle$; and if the measured state is $|1\rangle$, then the state of the qubit $|\psi\rangle_{out}$ would be $(\alpha \sin \theta_1 |0\rangle + e^{-\Gamma\tau}\beta \cos \theta_1 |1\rangle)/N_0$.

Assume $\theta_1$ had earlier been set by the controller 105 to $\tan^{-1} e^{\Gamma\tau}$. Using this value for $\theta_1$ in Equation (G), if the state of the ancillary qubit is measured to be $|0\rangle$, then the state of the qubit $|\psi\rangle_{out}$ would be $\alpha|0\rangle + \beta|1\rangle$. As previously stated, this is the original state of the qubit $|\psi\rangle_{in}$, which is thus recovered to its original state, despite the amplitude dampening caused by the weak measurement.

If the detector 104 measures a $|1\rangle$, then the state of the qubit $|\psi\rangle_{out}$ is:

$$|\psi\rangle = \frac{1}{N_1}(\alpha|0\rangle + e^{-2\Gamma\tau}\beta|1\rangle) \quad (H)$$

where $N_1 = \sqrt{|\alpha|^2 + |\beta|^2 e^{-4\Gamma\tau}}$. Thus, the state of the qubit $|\psi\rangle_{out}$ has not been recovered to the original state $|\psi\rangle_{in}$. To try and recover the original state, the controller 105 carries out another iteration of the above described process, but this time sets the value of $\theta$ to $\theta_2 = \tan^{-1} e^{2\Gamma\tau}$, where $\theta_2$ indicates a second iteration. Additionally, the qubit $|\psi\rangle_{out}$ is fed back to the reversing circuit 102. At the end of the second iteration, the controller 105 again measures the state of the ancillary bit. If the measured state is $|0\rangle$, then the original state of the qubit $|\psi\rangle_{in}$ would be recovered as $|\psi\rangle_{out}$. On the other hand, if the measured state is $|1\rangle$, then another iteration would be carried out.

In general, the controller 105 can carry out N iterations to recover the original state of the qubit $|\psi\rangle_{in}$, with the value of $\theta_n$ in each iteration N set to:

$$\theta_n = \tan^{-1} e^{2^{N-1}\Gamma\tau} \quad (I)$$

While reversing the qubit $|\psi\rangle_{in}$ using the reversing circuit 102 may require a number of iterations, the time required for these iterations is far less than the time required for a second weak measurement. For example, in a cavity QED system, the time required for a second weak measurement on a qubit can be in the order of a few milliseconds, whereas the time for a single iteration of the reversing circuit 102 can be in the order of tens of microseconds—approximately two orders of magnitude lower. Therefore, even if a few iterations of the reversing circuit 102 may be required to recover the original state of the qubit, the total time is far less than that required for reversing using a second weak measurement.

It is understood that the system 100 of FIG. 1, and in particular the reversing circuit 102, can be implemented in any physical system that can support a quantum computer. Examples of such physical systems are Josephson junctions, optical lattices, quantum dots, nuclear magnetic resonance systems, cavity quantum electrodynamics (QED), etc.

Figure 2:
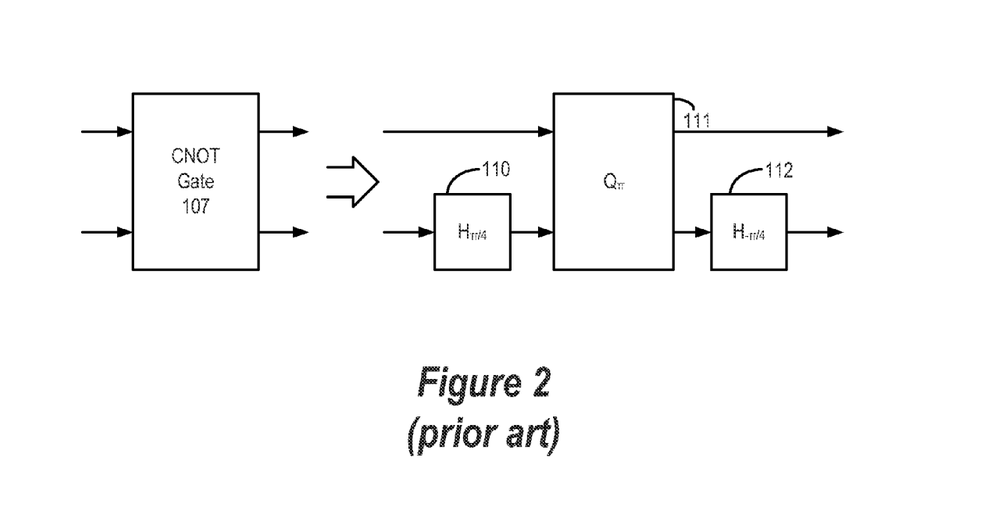
FIG. 2 shows building a CNOT gate with two Hadamard gates and a phase gate in accordance with the prior art.

A person skilled in the art will appreciate that high level quantum gates such as CNOT gates can be represented as a combination of universal quantum gates. As such, it is well known that the CNOT gate 107 of reversal circuit 102 can be built using two Hadamard gates 110 and 112 and phase gate 111, as shown in FIG. 2. Such decomposition of the CNOT gate 107 is beneficial when the physical system is a cavity QED system because implementation of Hadamard gates and phase gates in cavity QED systems are well understood in the art.

The just described-technique of the '587 shows utility in providing memory systems employing qubits, as it allows qubits to be read and then effectively recovered on small time scales. However, this technique does not deal with the possibility that two qubits in a memory system may become entangled. This disclosure expands the technique of the '587 to a two-qubit system, and shows that quantum entanglement, an important source of information in quantum computing, can be protected from amplitude dampening, whether such dampening occurs because of use of a weak measurement or otherwise. Protection of quantum entanglement allows the original states of the qubits to be recovered, or partially recovered with a certain probability.

DETAILED DESCRIPTION

Quantum entanglement, a critical resource of the quantum information and quantum computation, occurs when qubits (e.g., photons, atoms, etc.) interact. Quantum entanglement, like the states of qubits themselves, can be affected by amplitude damping, making recovery of the state of the system difficult.

Figure 3:
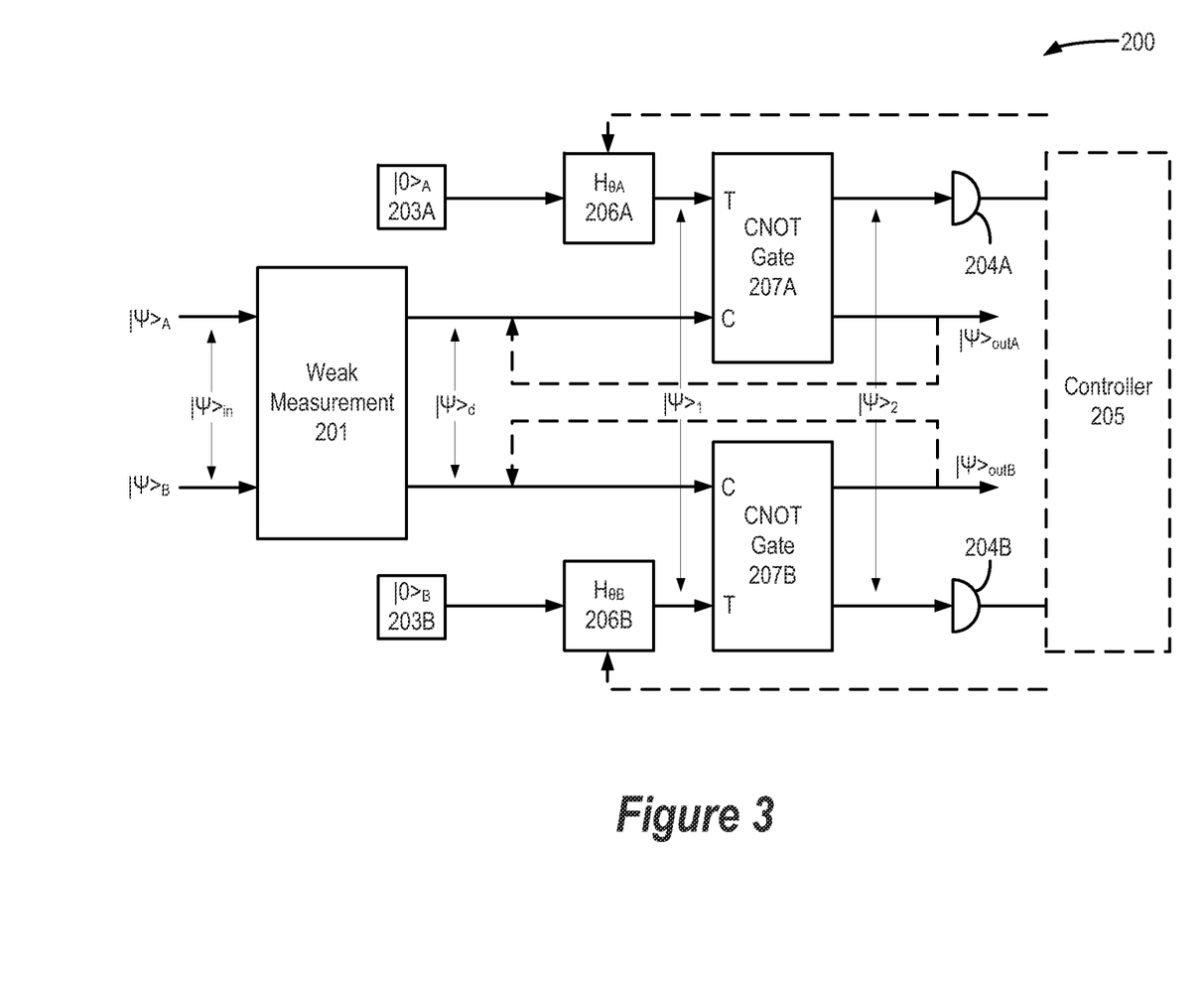
FIG. 3 shows a first example of a system for protecting quantum entanglement in a two qubit system employing use of a weak measurement.
Figure 5:
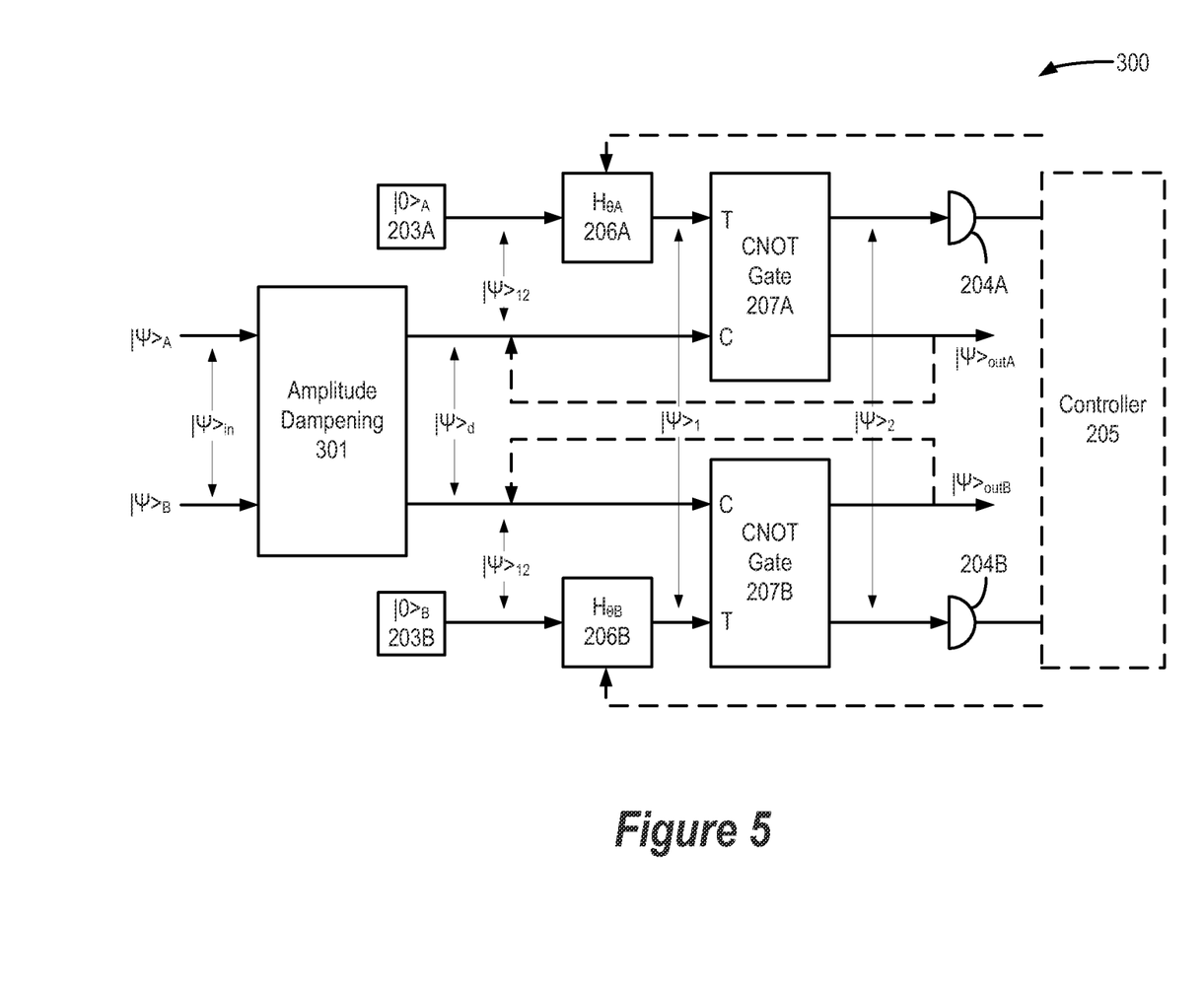
FIG. 5 shows a second example of a system for protecting quantum entanglement in a two qubit system without employing use of a weak measurement, but in which generalized amplitude dampening occurs.
Figure 7:
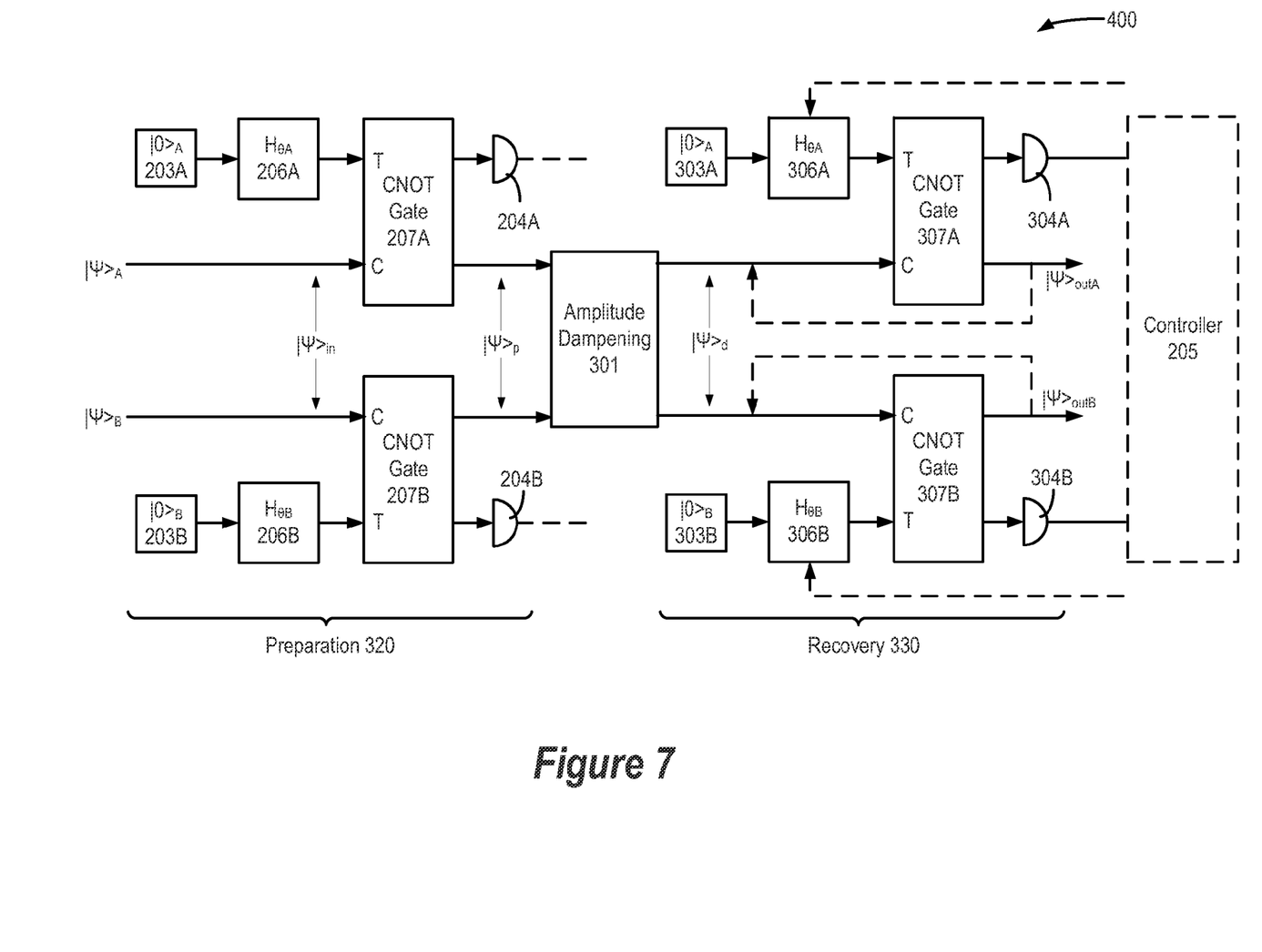
FIG. 7 shows a third example of a system for protecting quantum entanglement in a two qubit system without employing use of a weak measurement, in which the system is prepared to prevent decoherence prior to undergoing generalized amplitude dampening occurs.

In this disclosure, it is shown that a two-qubit system subject to amplitude damping by a weak measurement can also be probabilistically recovered (system 200; FIG. 3). Even when amplitude dampening occurs for generalized reasons other than a weak measurement, for example because of inherent "leakage" in the system that affects the qubits, quantum entanglement of a two-qubit system can also be partially protected using the disclosed technique, thereby increasing the chance of system recovery (system 300; FIG. 5). Even further improvement is seen when the system is prepared in a more robust state which is less susceptible to decoherence, what is referred to herein as an extended system (system 400; FIG. 7). Furthermore, the fidelity of the quantum states can be protected, particularly when the extended system is used.

System 200, in which two entangled qubits, $|\psi\rangle_A$ and $|\psi\rangle_B$, are subject to a weak measurement of the type described in the '587 patent, is consider first, and is shown in FIG. 3. An arbitrary state of a two-qubit system can be denoted as:

$$|\psi\rangle_{in} = \alpha|00\rangle_S + \beta|01\rangle_S + \gamma|10\rangle_S + \delta|11\rangle_S \quad (5)$$

where subscript S denotes the system 200.

When this state undergoes amplitude damping via a weak measurement (201), the amplitudes are modified. Such amplitude modification makes recovery of the states of the original qubits $|\psi\rangle_A$ and $|\psi\rangle_B$ difficult to ascertain, particularly given their entanglement. In a first embodiment of the invention, an extension of the technique of the '587 patent facilitates recovery of the states of the entangled two qubits, even after they are both dampened after a weak measurement.

In a weak measurement of a single bit, a null result at the detector yields the following mapping:

$$|0\rangle_S |0\rangle_E \rightarrow |0\rangle_S |0\rangle_E, \quad (3)$$

$$|1\rangle_S |0\rangle_E \rightarrow \sqrt{q} |1\rangle_S |0\rangle_E, \quad (4)$$

where q=1−p, p is the probability of decay of the excited state, and S and E denote the system and the environment. Using the Weisskopf-Wigner approximation, the probability of finding a qubit in an excited state decreases exponentially with time, such that:

$$\sqrt{q} = e^{-\Gamma \tau}. \quad (A)$$

When the entangled qubits of Equation 5 are subject to the mapping of Equations 3 and 4, the resulting state is:

$$|\psi\rangle_d = \frac{1}{N_d}(\alpha|00\rangle_S + \beta\sqrt{q}|01\rangle_S + \gamma\sqrt{q}|10\rangle_S + \delta q|11\rangle_S) \quad (6)$$

where $$N_d = \sqrt{|\alpha|^2 + q(|\beta|^2 + |\gamma|^2) + q^2|\delta|^2}.$$

is the normalization factor.

To recover the dampened quantum state back to the initial quantum state, two ancillary qubits 203A and 203B, $|0\rangle_A$ and $|0\rangle_B$, in the ground state are used. The ancillas 203A and 203B are subject to Hadamard gates 206A and 206B with an angle θ for each ancilla $$H_\theta = \begin{pmatrix} \cos\theta & -\sin\theta \\ \sin\theta & \cos\theta \end{pmatrix}. \quad (7)$$

The combined system is given by $$|\psi_1\rangle = \frac{1}{N_d}[\alpha|00\rangle_S + \beta\sqrt{q}|01\rangle_S + \gamma\sqrt{q}|10\rangle_S + \delta q|11\rangle_S] \otimes \quad (8)$$

$$(\cos\theta|0\rangle_A + \sin\theta|0\rangle_A)(\cos\theta|0\rangle_A + \sin\theta|0\rangle_A).$$

Two CNOT gates 207A and 207B are separately applied to each input qubit/ancilla qubit pair. If θ is chosen to be $\tan^{-1}(1/\sqrt{q})$, the combined state becomes $$|\psi_2\rangle = \frac{q}{N_d(1+q)}(\alpha|00\rangle_S + \beta|01\rangle_S + \gamma|10\rangle_S + \delta|11\rangle_S)|00\rangle_A + \quad (9)$$

$$\frac{\sqrt{q}}{N_d(1+q)}[\alpha|00\rangle^S + \beta q|01\rangle_S + \gamma|10\rangle_S + \delta|11\rangle_S]|01\rangle_A +$$

$$\frac{\sqrt{q}}{N_d(1+q)}[\alpha|00\rangle^S + \beta|01\rangle_S + q(\gamma|10\rangle_S + \delta|11\rangle_S)]|10\rangle_A +$$

$$\frac{1}{N_d(1+q)}[\alpha|00\rangle^S + q(\beta|01\rangle_S + \gamma|10\rangle_S) + \delta_q^2|11\rangle_S]|11\rangle_A$$

Figure 4:
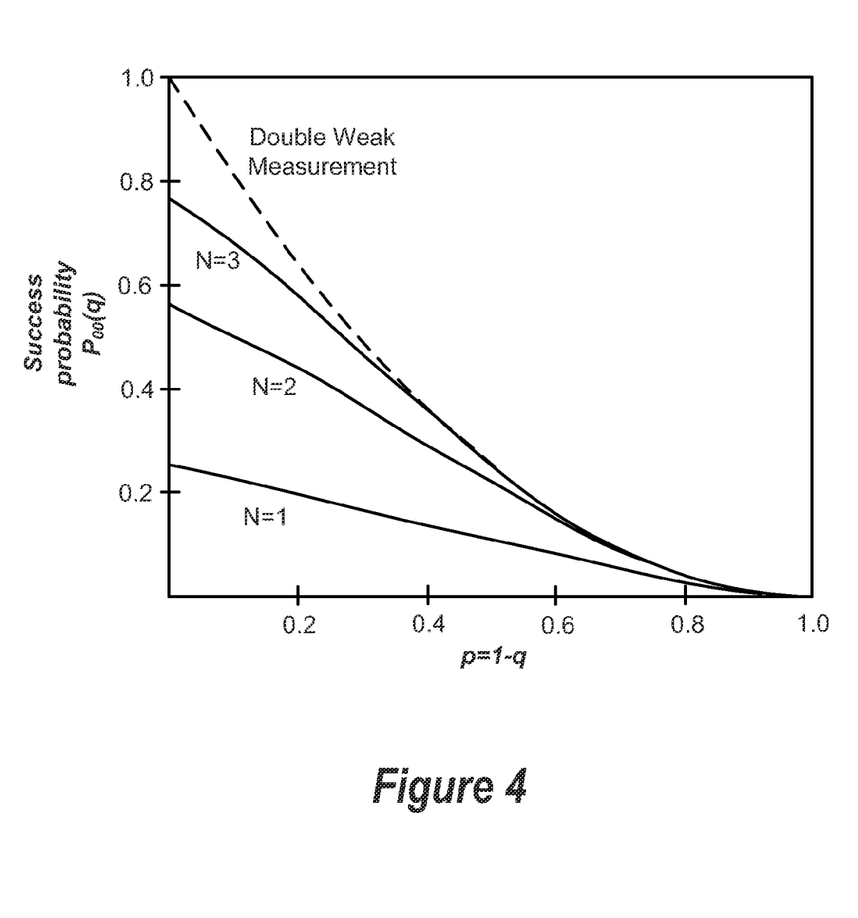
FIG. 4 shows the success probability of recovery using the system of FIG. 3 as a function of the decay probability of the system.

After the CNOT gates 207A and 207B, the ancilla qubits are measured at detectors 204A and 204B. From Equation 9, if the detectors 204A and 204B indicate a $|00\rangle$ result, the state of the system 200 recovers back to the initial state exactly: in other words, $|\psi\rangle_A$ is recovered as $|\psi\rangle_{outA}$, and $|\psi\rangle_B$ is recovered as $|\psi\rangle_{outB}$. The probability of this occurring, i.e., the success probability $P_{00}$, is $$P_{00}(q) = [q/N_d(1+q)]^2$$

which decreases as the decay probability p=1−q increases, as shown in FIG. 4.

If the detectors 204A and 204B indicate a $|01\rangle$ or $|10\rangle$ result, another iteration is performed on the affected qubit. For example, if $|01\rangle$ is indicated, this indicates that $|\psi\rangle_A$ has been recovered as $|\psi\rangle_{outA}$. By contrast, it can be inferred that $|\psi\rangle_B$ has decayed at a rate 2Γ, and thus hasn't been recovered as $|\psi\rangle_{outB}$. Another iteration is thus performed, similar to what occurred in the '587 patent: a new ancillary qubit 203B ($|0\rangle_B$) is provided, and the controller 205 adjusts the angle of Hadamard gate 207B to $\theta = \tan^{-1}(1/q)$, and feeds $|\psi\rangle_{outB}$ back to CNOT gate 207B. The following state results:

$$|\psi_2'\rangle = \frac{q}{\sqrt{1+q^2}}(\alpha|00\rangle_S + \beta|01\rangle_S + \gamma|10\rangle_S + \delta|11\rangle_S)|0\rangle_A + \quad (10)$$

-continued $$\frac{q}{\sqrt{1+q^2}}(\alpha|00\rangle_S + \beta q^2|01\rangle_S + \gamma|10\rangle_S + \delta q^2|11\rangle_S)|1\rangle_A$$

$|\psi\rangle_B$ is thus recovered as $|\psi\rangle_{outB}$ if the state of ancilla qubit is measured at detector 204B as $|0\rangle$ after the first iteration. The probability of this occurring is given by $P(q)=q^2/(1+q^2)$. If the detector 204B measures a $|1\rangle$, the effective decay rate is doubled and another iteration is performed with $\theta=\tan^{-1}(1/q^2)$. Repeating this procedure in successive iterations increases the probability to recover the quantum state $|\psi\rangle_B$ as $|\psi\rangle_{outB}$.

If the detectors 204A and 204B indicate $|11\rangle$, the state of the system is given by the last term in Eq. (9). Comparing this term with Eq. (6), the only difference is that the damping coefficient $\sqrt{q}$ is replaced by q, meaning that the decay rate has doubled. In this instance, the iteration occurs bilaterally: new ancillary qubits 203A and 203B are provided, and the controller 205 adjusts the angle of Hadamard gates 207A and 207B to $\theta=\tan^{-1}(1/q)$, and feeds $|\psi\rangle_{outA}$ back to CNOT gate 207A and $|\psi\rangle_{outB}$ back to CNOT gate 207B, etc.

The probability to recover $|\psi\rangle_A$ and $|\psi\rangle_B$ at $|\psi\rangle_{outA}$ and $|\psi\rangle_{outB}$ is dependent on the decay probability p, and depends on the number of iterations (N) necessary to eventually register $|00\rangle$ at the detectors 204A and 204B, as shown in FIG. 4. From FIG. 4, it is apparent the success probability of recovery decreases as the decay probability increases. If the quantum state is completely damped (p=1), the initial states of the qubits can't be recovered because all information has been lost during the weak measurements (201). Also evident from FIG. 4 is the increased success probability resulting from repeating the technique for a few iterations (N). If N is increased significantly, the success probability of a double weak measurement ($q^2$) (i.e., using an additional weak measurement instead of quantum gates to reverse a system that has undergone amplitude damping in a weak measurement with null-result.) can be approached, which is shown by the dashed line in FIG. 4. See also Q. Sun, et al., "Reversing the Weak Measurement of an Arbitrary Field with Finite Photon Number," Physical Review A, vol. 80, No. 3, pp. 033838-1-033838-5, Sep. 25, 2009 (describing double weak measurements). Nonetheless, practical experience teaches that three iterations are sufficient to achieve significant success probability, although of course this depends on the system.

FIG. 5 shows another system 300 for recovering the quantum state of a two-qubit system. Unlike system 200 introduced earlier, system 300 does not rely on the use of a weak measurement. Instead, inputs are subject to a general or inherent amplitude dampening 301, which can occur based on any number of factors in the environment, as mentioned earlier. Advantageously, this system 300 need not wait for measurement duration ($\tau$) to occur, as required during a weak measurement 201 in system 200. Still, two-qubit entanglement can be protected, and the original states of the qubits recovered to at least some probability.

As discussed in the previous section, a general two-qubit pure state is given by)

$$|\psi\rangle_{in}=\alpha|00\rangle+\beta|01\rangle+\gamma|10\rangle+\delta|11\rangle.$$

The concurrence of this state is $C_i=\max\{0, 2\alpha\delta-\beta\gamma\}$, which generally speaking indicates the entanglement between the two qubits.

General amplitude damping of a single qubit can be described by the following mapping:

$$|0\rangle_S|0\rangle_E \rightarrow |0\rangle_S|0\rangle_E, \qquad (1)$$

$$|1\rangle_S|0\rangle_E \rightarrow \sqrt{q}|1\rangle_S|0\rangle_E + \sqrt{p}|0\rangle_S|1\rangle_E, \qquad (2)$$

Assuming that the environment E is in the ground state, and applying the mapping of Equations 1 and 2, the evolution of the combined system after amplitude damping is given by $$|\psi_d\rangle = \alpha|00\rangle_S|00\rangle_E + \beta\sqrt{q}|01\rangle_S|00\rangle_E + \beta\sqrt{p}|00\rangle_S|01\rangle_E + \qquad (11)$$
$$\gamma\sqrt{q}|10\rangle_S|00\rangle_E + \gamma\sqrt{p}|00\rangle_S|10\rangle_E + \delta q|11\rangle_S|00\rangle_E +$$
$$\delta\sqrt{qp}|10\rangle_S|01\rangle_E + \delta\sqrt{qp}|01\rangle_S|10\rangle_E + \delta p|00\rangle_S|11\rangle_E.$$

Upon tracing out the environment, the density matrix for the system can be obtained, from which the damped concurrence can be determined as $$C_d(p)=\max\{0, 2q(|\alpha\delta-\beta\gamma|-p|\delta|^2)\}. \qquad (12)$$

This concurrence is lower than before amplitude dampening, and decreases as p increases. In other words, amplitude dampening decreases entanglement of the system.

To protect the entanglement, which is beneficial to recovery, two ancilla qubits 203A and 203B are used which are initially in the $|00\rangle$ state. The final state of the ancilla qubits are measured as before. There are four possible outcomes. If the result is $|00\rangle$, the density matrix of the system after tracing out the environment is $$\rho_f = \qquad (13)$$

$$\frac{1}{N_2}\begin{pmatrix} |\alpha|^2+p|\beta|^2+p|\gamma|^2+p^2|\delta|^2 & \alpha\beta^*+p\gamma\delta^* & \alpha\gamma^*+p\beta\delta^* & \alpha\delta^* \\ \alpha^*\beta+\gamma^*\delta p & |\beta|^2+|\delta|^2 p & \beta\gamma^* & \beta\delta^* \\ \alpha^*\gamma+p\beta^*\delta & \beta^*\gamma & |\gamma|^2+p|\delta|^2 & \gamma\delta^* \\ \alpha^*\delta & \beta^*\delta & \gamma^*\delta & |\delta|^2 \end{pmatrix}$$

where $N_2=1+p(|\beta|^2+|\gamma|^2+2|\delta|^2)+p^2|\delta|^2$. Note that this result is identical to the result as obtained via weak measurement reversal in system 200. The probability of this result is $[q/N_2(1+q)]^2$. The concurrence of the final state is given by $$C_r(p) = \max\left\{0, \frac{2(|\alpha\delta-\beta\gamma|-p|\delta|^2)}{1+p(1+|\delta|^2-|\alpha|^2)+p^2|\delta|^2}\right\}. \qquad (14)$$

Figure 6A:
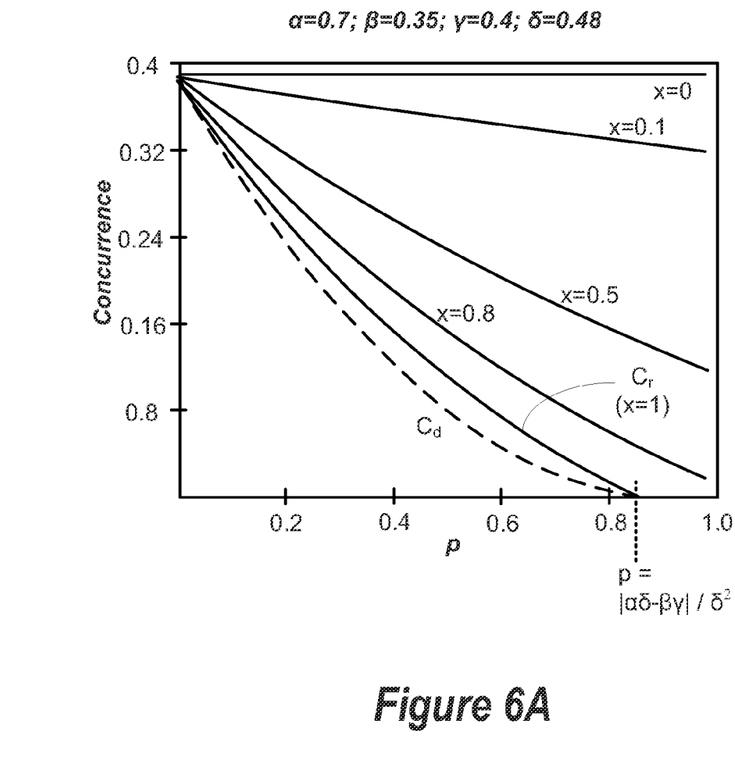
FIGS. 6A and 6B show concurrence for the systems of FIGS. 5 and 7 assuming particular values.
Figure 6B:
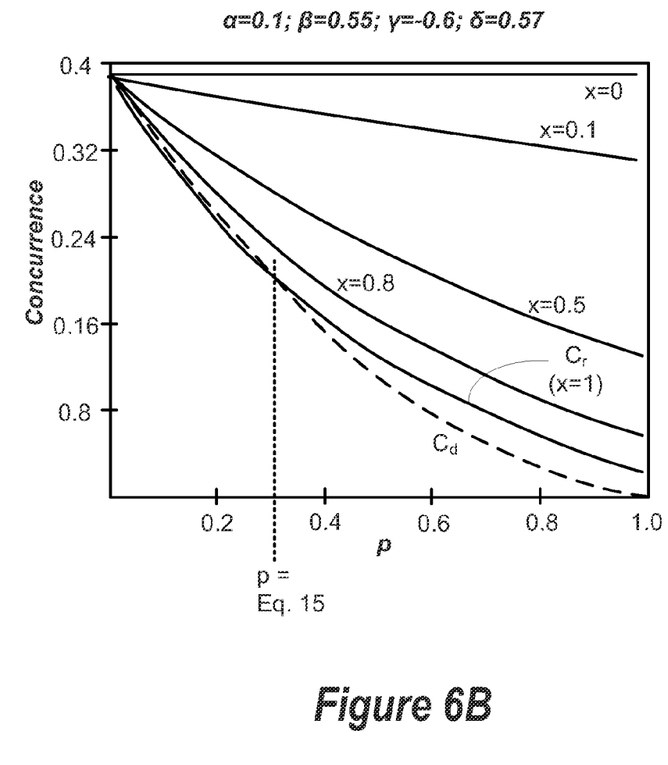

On comparing the concurrences $C_d(p)$ and $C_r(p)$, and with reference to FIGS. 6A and 6B, the following features are noted:

(1) If $|\alpha\delta-\beta\gamma|<|\delta|^2$, as occurs in FIG. 6A, entanglement vanishes at $p=|\alpha\delta-\beta\gamma|/\delta^2$ both for the dampened state and the recovered state. This is called entanglement sudden death (ESD). Beyond the ESD point, the state of the system is separable and the entanglement cannot be recovered. However, it will be shown later that entanglement of the system beyond the ESD point can be recovered by simply extending the system (FIG. 7).

(2) If $|\alpha|\geq|\delta|$, as also occurs in FIG. 6A, the final concurrence $C_r(p)$ is always larger than the dampened concurrence $C_d(r)$. Therefore, entanglement is always partially protected.

(3) If α<δ, as occurs in FIG. 6B, the final concurrence is higher than the damped concurrence only for $$p > |\sqrt{(1-|\alpha|^2+2|\delta|^2)^2 - 4|\delta|^2} - (1-|\alpha|^2)|/2|\delta|^2. \quad (15)$$

However, in the extended system to follow suitable parameters can be chosen such that the concurrence always increases for all p values.

If the ancilla qubits are not in the |00⟩ state, additional processing such as providing further iterations can occur, as discussed previously. Eventually, when the ancilla qubits are both measured to be in the |0⟩ state, the density matrix of the system after tracing out the environment is the same as Equation 13. In other words, even if a |00⟩ result isn't measured, additional procedures can increase the probability that quantum entanglement is protected.

FIG. 7 shows the extended system 400 referred to earlier. As will be shown, this extended system 400 increases the probability of successful recovery as compared to system 300 of FIG. 5, again without the need for a weak measurement.

Extended system 400 comprises a preparation stage 320 and a recovery stage 330. Each of these stages 320 and 330 can be similar in design, and similar to the basic system 200 shown in FIG. 3 earlier, with each comprising two ancilla qubits (203A and 203B; 303A and 303B), two Hadamard gates (206A and 206B; 306A and 306B), two CNOT gates (207A and 207B; 307A and 307B), and two detectors (204A and 204B; 304A and 304B). A general amplitude dampening stage 301 intervenes between the two serially-connected preparation and recovery stages 320 and 330.

The preparation stage 320 prepares the system into a more robust quantum state, $|\psi\rangle_p$. If the ancilla qubits 203A and 203B are measured to be |00⟩ at detectors 204A and 204B, the preparation is successful, and recovery can commence; otherwise the result is discarded, and preparation is repeated. The state $|\psi\rangle_p$ after successful preparation is set forth in Eq. (27) of the above-referenced paper, which is lengthy to set forth here. If this equation is modified such that q=1 (indicative that no dampening has yet occurred), θ=θ₁ in the Hadamard gates 206A and 206B, and if we define x=tan²θ₁, we obtain $$|\psi_P\rangle = \frac{1}{N_1}(\alpha|00\rangle + \beta\sqrt{x}|01\rangle + \gamma\sqrt{x}|10\rangle + \delta x|11\rangle) \quad (18)$$

where $$N_1 = \sqrt{|\alpha|^2 + |\beta|^2 x + |\gamma|^2 x + |\delta|^2 x^2}.$$

and where x=tan²θ₁. The success probability of preparation is $N_1^2/(1+x)^2$. If x is less than 1 though the appropriate choice of θ₁, the system uncollapses toward the ground state, which is similar in effect to a weak measurement. The ground state is uncoupled to the environment and is less vulnerable to decoherence. Furthermore, because a weak measurement is not taken per se, one does not need to wait the time necessary for a null-result weak measurement.

After preparing the system in the state shown in Equation 18, the system undergoes the amplitude damping and the recovery procedure. In the recovery stage 330, we choose the rotation angle θ₂ of the Hadamard gates 306A and 306B such that xqy=1, where y=tan²θ₂. The states of the ancilla qubits are measured at detectors 304A and 304B, and if |00⟩ results, the density matrix of the system 400 becomes $$\rho_f = \frac{1}{N_2}\begin{pmatrix} |\alpha|^2 + px|\beta|^2 + \\ px|\gamma|^2 + p^2x^2|\delta|^2 & \alpha\beta^* + px\gamma\delta^* & \alpha\gamma^* + px\beta\delta^* & \alpha\delta^* \\ \alpha^*\beta + px\gamma^*\delta & |\beta|^2 + px|\delta|^2 p & \beta\gamma^* & \beta\delta^* \\ \alpha^*\gamma + px\beta^*\delta & \beta^*\gamma & |\gamma|^2 + px|\delta|^2 & \gamma\delta^* \\ \alpha^*\delta & \beta^*\delta & \gamma^*\delta & |\delta|^2 \end{pmatrix} \quad (19)$$

where $$N_2 = 1 + px(|\beta|^2 + |\gamma|^2 + 2|\delta|^2) + p^2x^2|\delta|^2$$

is the normalization factor. The concurrence of the final quantum state is given by $$C_r(p, x) = \max\left\{0, \frac{2(|\alpha\delta - \beta\gamma| - px|\delta|)}{1 + px(1 - |\alpha|^2 - |\delta|^2) + p^2|\delta|^2}\right\}. \quad (20)$$

On comparing this concurrence with $C_r(p)$ in Equation 14 and the damped concurrence $C_d(p)$ in Equation 13 for the un-extended system 200 of FIG. 5, several new features are noticed:

When x=1, $C_r(p,x)=C_r(p)$. This shows that the un-extended system 500 of FIG. 5 comprises a special case of the extended system 400 of FIG. 7.

If x is small enough, $C_r(p,x)$ is always larger than $C_d(p)$, as shown in FIGS. 6A and 6B for examples x values 0, 0.1, 0.5, and 0.8. This differs from system 300, where there are always some states where the concurrence cannot be improved, i.e., where $C_d(p)>C_r(p)$ (see Eq. 15 and FIG. 6B).

If x is less than 1, the concurrence can be nonzero even if the damped concurrence is zero, as shown in FIG. 6A. This means that the quantum entanglement can be partially recovered even beyond the ESD point, which never happens in the system 300.

As x approaches 0, the concurrence is max {0,2|αδ−βγ|}, which is the concurrence of the initial state, i.e., entanglement is recovered back to the initial state. However, as x approaches 0, the success probability also approaches zero. Therefore, there is a tradeoff between the success probability and entanglement protection.

Note that in each of these observations, x can be modified by the user to an appropriate value by tailoring the angles θ used in the Hadamard gates.

In short, in each of systems 200, 300, and 400, quantum entanglement can be at least partially protected, allowing at least some possibility of system recovery. Quantum state fidelity, which comprises a measure of the "closeness" of two quantum states, can also be probabilistically preserved. The fidelity between the two quantum states is given by:

$$F(\rho_i,\rho_f) = [Tr(\sqrt{\sqrt{\rho_i}\rho_f\sqrt{\rho_i}})]^2 = Tr(\rho_i\rho_f) \quad (21)$$

where $\rho_i$ and $\rho_f$ are the initial and final state, respectively. The second identity is valid when the initial state is pure, which is assumed.

For a general two-qubit dampened state (Eq. 11), the fidelity between this state and the initial state is $$F_d(p) = (\alpha^2 + \sqrt{q}\beta^2 + \sqrt{q}\gamma^2 + q\delta^2)^2 + 4p \\ \sqrt{q}\alpha\beta\gamma\delta + p[\alpha^2 + q\delta^2](\beta^2 + \gamma^2) + p^2\alpha^2\delta^2. \quad (22)$$

For the recovered quantum state in system 300 of FIG. 5 (see Eq. 13), the fidelity is $$F_r(p) = \frac{1 + 4p\alpha\beta\gamma\delta + p(\alpha^2 + \delta^2)(\beta^2 + \gamma^2) + p^2\alpha^2\delta^2}{1 + p(1 - \alpha^2 + \delta^2) + p^2\delta^2} \quad (23)$$

For the recovered quantum state in extended system 400 of FIG. 7 (see Eq. 19), the fidelity is $$F'_r(p) = \frac{1 + 4px\alpha\beta\gamma\delta + px^2(\alpha^2 + \delta^2)(\beta^2 + \gamma^2) + p^2x^2\alpha^2\delta^2}{1 + px(1 - \alpha^2 + \delta^2) + p^2x^2\delta^2} \quad (24)$$

Figure 8:
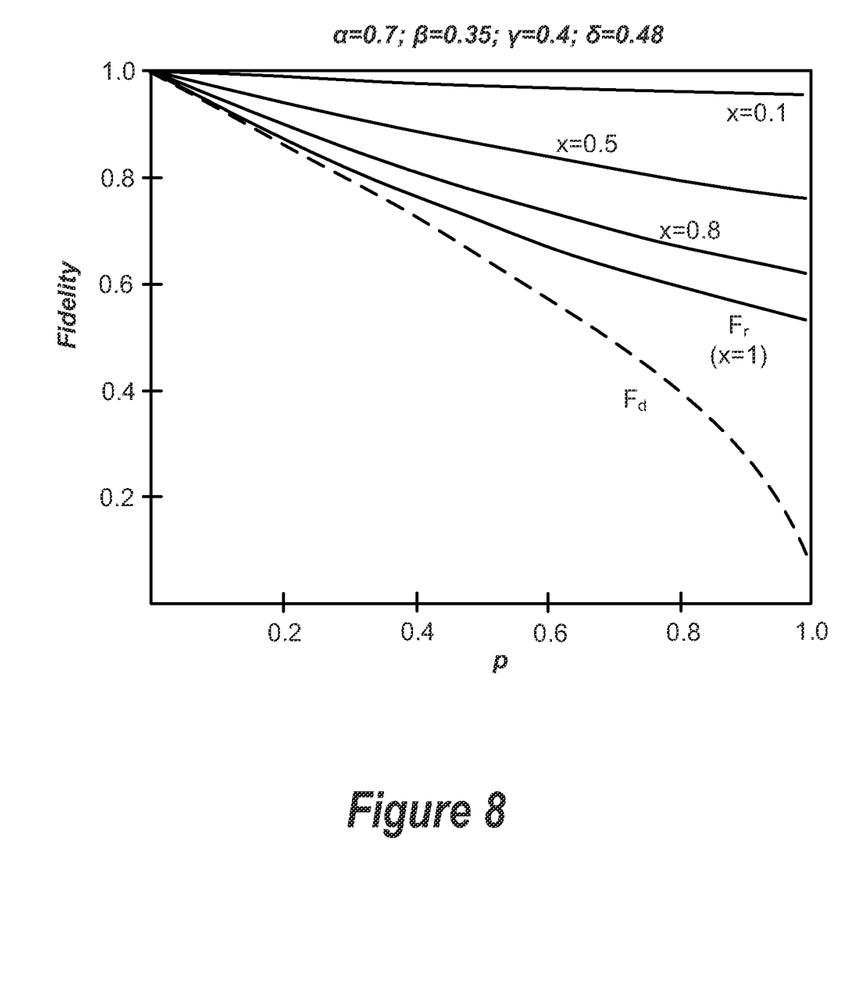
FIG. 8 shows the quantum fidelity of the various disclosed systems as a function of the decay probability of the system.

Comparing Equations 23 and 24, and referring to FIG. 8, we find that $F_r(p)$ is a special case of $F'_r(p)$ when x=1. As x decreases in the extended system 400, the fidelity increases. When x approaches 0, the fidelity $F'_r(p)$ of the extended scheme approaches 1, meaning that the quantum state is recovered back to the initial state. Therefore, the fidelity of the quantum state can also be well preserved in the extended scheme. But again, the success probability also decreases as x decreases.

As in the systems disclosed earlier, if the ancilla qubits are not in the |00⟩ state, additional processing such as providing further iterations can occur, as discussed previously, to increase the probability that quantum entanglement is protected and that the system can be recovered.

Figure 9:
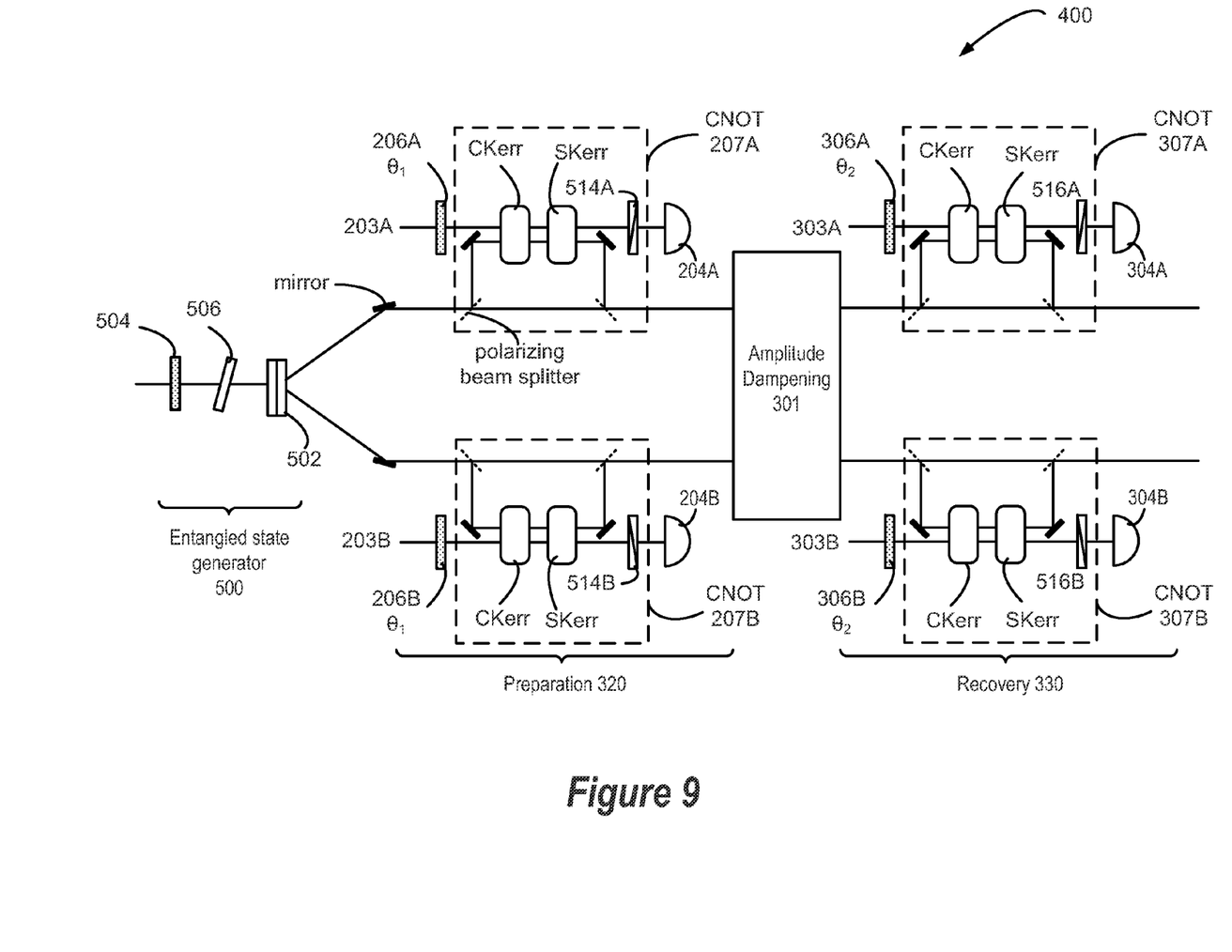
FIG. 9 shows an embodiment of the system of FIG. 7 in the form of a linear optics system, although the illustrated hardware could also apply where relevant to the systems of FIGS. 3 and 5 as well.

FIG. 9 shows an implementation of system 400 of FIG. 7 in the form of a linear optics system. The system includes four parts: an entangled state generation subsystem 500, a state preparation subsystem 320, an amplitude damping system 301, and recovery subsystem 330, some of which were discussed in general terms in the system 400 of FIG. 7. The system controller 205 is not illustrated in FIG. 9 for simplicity, nor are feedback paths allowing for additional iterations, as described earlier. As one skilled in the art will appreciate, the hardware and concepts employed in FIG. 9 can also be used where relevant to implement the system 200 of FIG. 3, and system 300 of FIG. 5. Implementations of these systems 200 and 300 however are not shown for convenience, and will be obvious to those of skill in the art given this description.

The entangled state generation subsystem 500 generates a polarization-entangled photon pair using two adjacent type-I crystals 502, which can comprise beta barium borate (BBO) crystals in one example. The outcome state is given by:

$$|\psi\rangle = \alpha|HH\rangle + \beta|VV\rangle, \quad (15)$$

where H is the horizontal polarization and denoted as the |0⟩ state, while V is the vertical polarization and denoted as the |1⟩ state. α and β are complex numbers controlled by a half-wave-plate (HWP) 504 and a tilted quarter-wave plate (QWP) 506 placed before the crystals 502. HWP 504 can also be used to rotate one of the photons, or use type-II phase matching to generate entangled photons with orthogonal polarizations:

$$|\psi\rangle = \alpha|HV\rangle + \beta|VH\rangle. \quad (16)$$

The two entangled qubits are then spatially separated and proceed to state preparation subsystem 320. As shown in FIG. 7, state preparation subsystem 320 employs CNOT gates 207A and 207B. Implementation of CNOT gates in a linear optics system as shown in FIG. 9 can be achieved using the technique described by D'Ariano et. al., "Quantum Computations with Polarized Photons," Fortschr. Phys., Vol. 48 at 573-577 (2000), which is incorporated by reference herein, and in which Cross-Kerr media (CKerr) and Self-Kerr media (SKerr) are used. The ancilla qubits 203A and 203B are photons which are horizontally polarized initially. HWPs 206A and 206B act as Hadamard gates to rotate the polarizations of ancilla qubits 203A and 203B by $\theta_1$, and the resulting polarization becomes $\cos\theta_d|H\rangle + \sin\theta_d|V\rangle$. Polarizers 514A and 514B are horizontally polarized. If a photon is detected at both detectors 204A and 204B, state preparation is successful, as noted earlier with reference to FIG. 7.

After state preparation, the system qubits undergo amplitude damping 301, which as mentioned earlier can comprise any generalized amplitude dampening, or which may result from a weak measurement. After such dampening, the system state is recoverable in recovery subsystem 330 by using hardware similar to the preparation subsystem 320, as shown in FIG. 9, and as discussed in detail with respect to FIG. 7. The only difference in recovery subsystem 330 is that the ancilla qubits 303A and 303B are rotated by an angle $\theta_2$. For the optimal recovery, $\theta_2$ imposed by Hadamard gates (HWPs) 306A and 306B should be chosen such that $\tan\theta_1 \cos\theta_d \tan\theta_2 = 1$, i.e., xqy=1 as mentioned earlier with reference to FIG. 7. After CNOT gates 307A and 307B, the ancilla qubits 303A and 303B are measured using detectors 304A and 304B respectively. If both ancilla qubits are in horizontal polarization, protection succeeds and the system qubits are well recovered. To prove the result, the same procedure can be repeated simply by changing the polarizations of polarizers 516A and 516B, and the quantum state can be tomographied from which one can calculate the concurrence and fidelity, as discussed above.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. Thus, the present invention is intended to cover alternatives, modifications, and equivalents that may fall within the spirit and scope of the present invention as defined by the claims.

What is claimed is:

1. An apparatus for at least partially recovering a two qubit system, comprising:
    an amplitude dampening system into which a first qubit and a second qubit are input;
    a first ancillary qubit prepared in state |0⟩;
    a second ancillary qubit prepared in state |0⟩;
    a first Hadamard gate, wherein the first Hadamard gate receives the first ancillary qubit;
    a second Hadamard gate, wherein the second Hadamard gate receives the second ancillary qubit;
    a first CNOT gate comprising a first control input receiving the first qubit after amplitude dampening, a first target input receiving the output of the first Hadamard gate, a first control output producing a transformed first qubit, and a first target output producing a transformed first ancillary qubit;
    a second CNOT gate comprising a second control input receiving the second qubit after amplitude dampening, a second target input receiving the output of the second Hadamard gate, a second control output producing a transformed second qubit, and a second target output producing a transformed second ancillary qubit;
    wherein the transformed first and second ancillary qubits are assessed to determine to what extent the two bit system has been recovered.

2. The apparatus of claim 1, wherein the amplitude dampening system comprises a weak measurement system for measuring the first and second qubits after a duration τ.

3. The apparatus of claim 1, further comprising:
a first detector for assessing the transformed first ancillary qubit; and
a second detector for assessing the transformed second ancillary qubit.

4. The apparatus of claim 1, further comprising a controller for receiving the outputs from the first and second detectors.

5. The apparatus of claim 4, wherein if the transformed first and second ancillary qubits are assessed as state $|00\rangle$, then the controller determines that two qubit system has been recovered.

6. The apparatus of claim 4, wherein if the transformed first ancillary qubit is not assessed as state $|0\rangle$, then the controller is configured to input the transformed first qubit to the first control input of the first CNOT gate, and to provide a new first ancillary qubit to the first target input of the first CNOT gate.

7. The apparatus of claim 6, wherein the controller is further configured to change a rotation angle of the first Hadamard gate.

8. The apparatus of claim 4, wherein if the transformed first and second ancillary qubits are assessed as state $|11\rangle$, then the controller is configured to
input the transformed first qubit to the first control input of the first CNOT gate, and to provide a new first ancillary qubit to the first target input of the first CNOT gate, and
input the transformed second qubit to the second control input of the second CNOT gate, and to provide a new second ancillary qubit to the second target input of the second CNOT gate.

9. The apparatus of claim 8, wherein the controller is further configured to change a rotation angle of the first or second Hadamard gates.

10. The apparatus of claim 1, wherein a rotation angle of the first and second Hadamard gates comprises $\tan^{-1}(e^{\Gamma t})$, wherein $\Gamma$ is the decay rate of the amplitude dampening system.

11. The apparatus of claim 1, wherein the first and second Hadamard gates comprise half wave plates.

12. The apparatus of claim 1, wherein the first and second CNOT gates comprise Cross-Kerr and Self-Kerr media.

13. The apparatus of claim 1, further comprising a preparation stage for preparing the first and second qubits.

14. The apparatus of claim 13, wherein the preparation stage comprises:
a third ancillary qubit prepared in state $|0\rangle$;
a fourth ancillary qubit prepared in state $|0\rangle$;
a third Hadamard gate, wherein the third Hadamard gate receives the third ancillary qubit;
a fourth Hadamard gate, wherein the fourth Hadamard gate receives the fourth ancillary qubit;
a third CNOT gate comprising a third control input receiving a third qubit, a third target input receiving the output of the third Hadamard gate, a third control output producing the first qubit, and a third target output producing a transformed third ancillary qubit; and
a fourth CNOT gate comprising a fourth control input receiving a fourth qubit, a fourth target input receiving the output of the fourth Hadamard gate, a fourth control output producing the second qubit, and a fourth target output producing a transformed fourth ancillary qubit,
wherein the transformed third and fourth ancillary qubits are assessed to determine whether the first and second qubits have been prepared.

15. The apparatus of claim 14, wherein the first and second qubits are prepared if the transformed third and fourth ancillary qubits are assessed as state $|00\rangle$.

16. The apparatus of claim 14, wherein the first and second Hadamard gates are rotated at different angles than the third and fourth Hadamard gates.

17. The apparatus of claim 16, wherein the rotation angle of the first and second Hadamard gates is $\theta_2 = \tan-1(\sqrt{y})$, the rotation angle of the third and fourth Hadamard gates is $\theta_1 = \tan-1(\sqrt{x})$, and wherein $xqy=1$, wherein q represents a decay rate in the amplitude dampening stage.

18. The apparatus of claim 14, wherein the third and fourth Hadamard gates comprise half wave plates.

19. The apparatus of claim 14, wherein the third and fourth CNOT gates comprise Cross-Kerr and Self-Kerr media.

20. The apparatus of claim 14, wherein the third and fourth qubits comprise a polarization-entangled photon pair.

* * * * *